(12) United States Patent  (10) Patent No.: US 9,301,377 B2
Oh et al.  (45) Date of Patent: Mar. 29, 2016

(54) CIRCUIT FOR PREVENTING STATIC ELECTRICITY OF A DISPLAY PANEL AND DISPLAY DEVICE INCLUDING THE SAME

(71) Applicant: Samsung Display Co., Ltd., Yongin, Gyeonggi-do (KR)

(72) Inventors: Woo-Jin Oh, Yongin (KR); Yang-Wan Kim, Yongin (KR); Won-Kyu Kwak, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 77 days.

(21) Appl. No.: 13/744,071

(22) Filed: Jan. 17, 2013

(65) Prior Publication Data

US 2014/0104741 A1  Apr. 17, 2014

(30) Foreign Application Priority Data

Oct. 15, 2012  (KR) .................. 10-2012-0114394

(51) Int. Cl.
*H02H 9/00* (2006.01)
*H05F 3/00* (2006.01)
*G09G 3/00* (2006.01)
*H05K 1/02* (2006.01)

(52) U.S. Cl.
CPC .................. *H05F 3/00* (2013.01); *G09G 3/006* (2013.01); *H02H 9/00* (2013.01); *H05K 1/0259* (2013.01); *H05K 2201/10128* (2013.01)

(58) Field of Classification Search
CPC .................................. H05F 3/00; H02H 9/046
See application file for complete search history.

(56) References Cited

U.S. PATENT DOCUMENTS

| 5,627,394 | A  | * | 5/1997 | Chang et al. | .................. 257/335 |
| 8,742,784 | B2 | * | 6/2014 | Kim et al.   | ................ 324/760.01 |
| 2005/0200574 | A1 | * | 9/2005 | Goto et al. | ...................... 345/76 |

FOREIGN PATENT DOCUMENTS

| KR | 10-2006-0000428 A |   | 1/2006 |
| KR | 10-0839754 B1     |   | 6/2008 |
| KR | 10-2011-0012570 A |   | 2/2011 |
| KR | 10-2012-0004788 A |   | 1/2012 |
| KR | 1020120004788     | * | 1/2012 |

\* cited by examiner

*Primary Examiner* — Thienvu Tran
*Assistant Examiner* — Tien Mai
(74) *Attorney, Agent, or Firm* — Knobbe Martens Olson & Bear LLP

(57) ABSTRACT

A static electricity preventing circuit and a display device including the same are disclosed. In one aspect, the static electricity preventing circuit includes a power source voltage supply unit configured to apply a power source voltage to drive a display panel, wherein the display panel comprises a plurality of pixels respectively displaying images through light emission according to data voltages of image data signals. It also includes a signal wire unit configured to transmit lighting test signals for a lighting test of the pixels included in the display panel. It further includes a resistor unit positioned between the power source voltage supply unit and the signal wire unit and configured to discharge static electricity generated in the signal wire unit through the power source voltage supply unit.

8 Claims, 5 Drawing Sheets

CIRCUIT FOR PREVENTING STATIC ELECTRICITY OF A DISPLAY PANEL AND DISPLAY DEVICE INCLUDING THE SAME

CROSS-REFERENCE TO RELATED APPLICATION

This application claims priority to and the benefit of Korean Patent Application No. 10-2012-0114394 filed in the Korean Intellectual Property Office on Oct. 15, 2012, the entire contents of which are incorporated herein by reference.

BACKGROUND

1. Field

The disclosed technology generally relates to a static electricity preventing circuit of a display panel and a display device including the same.

2. Description of the Related Technology

In general, a flat panel display such as an organic light emitting diode (OLED) display has an application range that has been rapidly increasing due to its low weight, thinness, low power consumption, good color representation, and high resolution realization. Currently, usage of the OLED display has increased in computers, laptops, phones, TVs, and audio/video devices.

The static electricity generated in a panel manufacturing process may generate a process defect and damage an element inside the panel. Therefore, a static electricity preventing component is preferred in the flat display panel. When a static electricity preventing circuit is installed between a wire connected to the display panel and supplying a power source voltage to drive the display panel and a wire supplying a signal required for a lighting test, a breaking damage may be frequently generated in the static electricity preventing circuit due to a high potential difference created by the static electricity. That is, an interval between the power supply wire and the signal supply wire is very narrow such that short circuit damage may be generated by a voltage difference flowing in each wire, thereby generating deterioration in the entire driving of the display panel. Therefore, there is a need to protect the display panel from the breaking damage of the static electricity preventing circuit.

SUMMARY

One aspect of the disclosed technology is to prevent inflow and generation of static electricity generated in a display panel to prevent an erroneous operation and damage to the display panel, and a process deterioration of the display device due to the static electricity.

Another aspect of the disclosed technology provides a static electricity rigidity design circuit to protect the circuit from breaking damage of the static electricity preventing circuit, thereby providing the display panel with an excellent quality and efficiently solve a driving deterioration caused by static electricity inflow in the display device.

A static electricity preventing circuit according to an embodiment includes: a power source voltage supply unit applying a power source voltage to drive a display panel at which a plurality of pixels respectively display an image through light emitting according to a data voltage depending on an image data signal; a signal wire unit supplying a lighting test signal having a predetermined voltage value for a lighting test of a plurality of pixels included in the display panel; and a resistor unit provided between the power source voltage supply unit and the signal wire unit and inducing a current due to static electricity generated in the signal wire unit to be discharged through the power source voltage supply unit.

The resistor unit may include a semiconductor layer including a predetermined impurity doping region doped with a semiconductor impurity and an intrinsic semiconductor region where the semiconductor impurity is not doped, and a gate metal layer formed on the semiconductor layer via an insulation layer interposed therebetween.

The gate metal layer may be in a floated state when the static electricity is not dissipated.

The impurity doping region of the semiconductor layer may include a first impurity doping region electrically connected to the signal wire unit; and a second impurity doping region facing the first impurity doping region and electrically connected to the power source voltage supply unit.

The power source voltage supply unit may include a first power source voltage supply unit applying the first power source voltage of a predetermined high potential and a second power source voltage supply unit applying the second power source voltage of a low potential that is lower than the first power source voltage. The resistor unit may be connected to the first power source voltage supply unit.

The signal wire unit may include a plurality of signal supply wires respectively transmitting a plurality of lighting test signals transmitted to a plurality of pixels included in the display panel and having different voltage values.

The different voltage values may be voltages respectively corresponding to image data voltages for light emitting a plurality of pixels into light of red, green, and blue.

The signal wire unit may include a plurality of signal supply wires respectively transmitting a plurality of lighting test signals transmitted to a plurality of pixels included in the display panel and having different voltage values, and a plurality of signal supply wires may be respectively connected to the resistor unit through a plurality of the first connection wires.

The power source voltage supply unit may include a first power source voltage supply unit applying the first power source voltage of a predetermined high potential and a second power source voltage supply unit applying the second power source voltage of a low potential that is lower than the first power source voltage, and the resistor unit may be connected to the first power source voltage supply unit through a second connection wire including a main connection wire connected to a portion of a region of the resistor unit, and at least one sub-connection wire having one end connected to the main connection wire and the other end connected to the first power source voltage supply unit.

The resistor unit may include a semiconductor layer including the first impurity doping region electrically connected to the signal wire unit and the second impurity doping region electrically connected to the power source voltage supply unit, and a gate metal layer formed on a remaining region except for the first impurity doping region and the second impurity doping region among the semiconductor layer via the semiconductor layer and the insulation layer, and a channel may be formed between the first impurity doping region and the second impurity doping region among the semiconductor layer due to static electricity generated in the signal wire unit.

The potential of the static electricity may be higher than a power source voltage applied in the power source voltage supply unit.

A display device including a static electricity preventing circuit according to an exemplary embodiment of the present invention includes: a display panel including a plurality of pixels, wherein the plurality of pixels respectively display an image through light emitting according to a data voltage depending on an image data signal; a first power source voltage supply unit applying a first power source voltage of a high potential driving the display panel and a second power source voltage supply unit applying a second power source voltage of a low potential that is lower than the first power source voltage; a signal wire unit supplying a lighting test signal having a predetermined voltage value for a lighting test of a plurality of pixels included in the display panel; and a resistor unit provided between the first power source voltage supply unit and the signal wire unit and inducing a current due to static electricity generated in the signal wire unit to be discharged through the first power source voltage supply unit.

In some embodiments, inflow and generation of the static electricity into the display panel may be prevented such that an erroneous operation and damage to the display panel, as well a process deterioration of the display device due to the static electricity, may be prevented.

Additionally, by providing the static electricity rigidity design circuit to protect the circuit from breaking damage of the static electricity preventing circuit, the driving deterioration caused by the static electricity inflow is efficiently solved in the display device such that a display panel having an excellent quality and a display device including the display panel may be provided.

DETAILED DESCRIPTION OF CERTAIN INVENTIVE EMBODIMENTS

Figure 1:
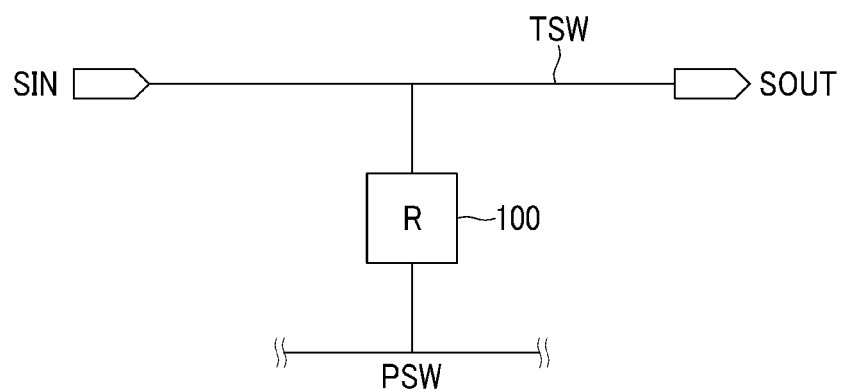
FIG. 1 is a schematic view of a static electricity preventing circuit of a display panel according to an embodiment.

Embodiments will be described more fully hereinafter with reference to the accompanying drawings As those skilled in the art would realize, the described embodiments may be modified in various different ways, all without departing from the spirit or scope of the present invention.

Constituent elements having the same structures throughout the embodiments are denoted by the same reference numerals and are described in a first embodiment. In other embodiments, only constituent elements other than the same constituent elements will be described.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a schematic view of a static electricity preventing circuit of a display panel according to an embodiment.

Referring to FIG. 1, a static electricity preventing circuit of a static electricity preventing display panel includes a predetermined resistor unit 100 between a power source voltage supply wire PSW receiving and applying a power source voltage to drive a display panel from a power source voltage supply source, and a signal supply wire TSW supplying a signal for a lighting test of the display panel.

The power source voltage supply wire PSW may be a wire supplying a predetermined first power source voltage to the display panel. At this time, the first power source voltage may be a power source voltage of a high level.

The signal supply wire TSW as a wire supplying a voltage for the lighting test of each pixel included in the display panel may supply a corresponding voltage to display a color such as red, green, and blue. As shown in FIG. 1, the voltage for the lighting test is transmitted from a signal input terminal SIN to a direction of a signal output terminal SOUT.

The predetermined resistor unit 100 includes one end connected to the wire PSW supplying the first power source voltage according to an object of the protection circuit and the other end connected to the signal supply wire TSW for the lighting test.

A resistor element configuring the resistor unit 100 is not particularly limited, but according to an embodiment, the resistor unit 100 may be formed by using polysilicon (Poly-Si) and a floated gate metal.

In detail, the resistor unit 100 may be formed by using a semiconductor layer including polysilicon and a gate metal layer formed thereon. At this time, the gate metal layer is not electrically connected to be floated. The detailed constitutions of the resistor unit 100 will be described with reference to accompanying drawings.

Meanwhile, a resistance of the resistor unit 100 is not limited, but may be designed from several kilo-ohms to several mega-ohms.

Figure 2:
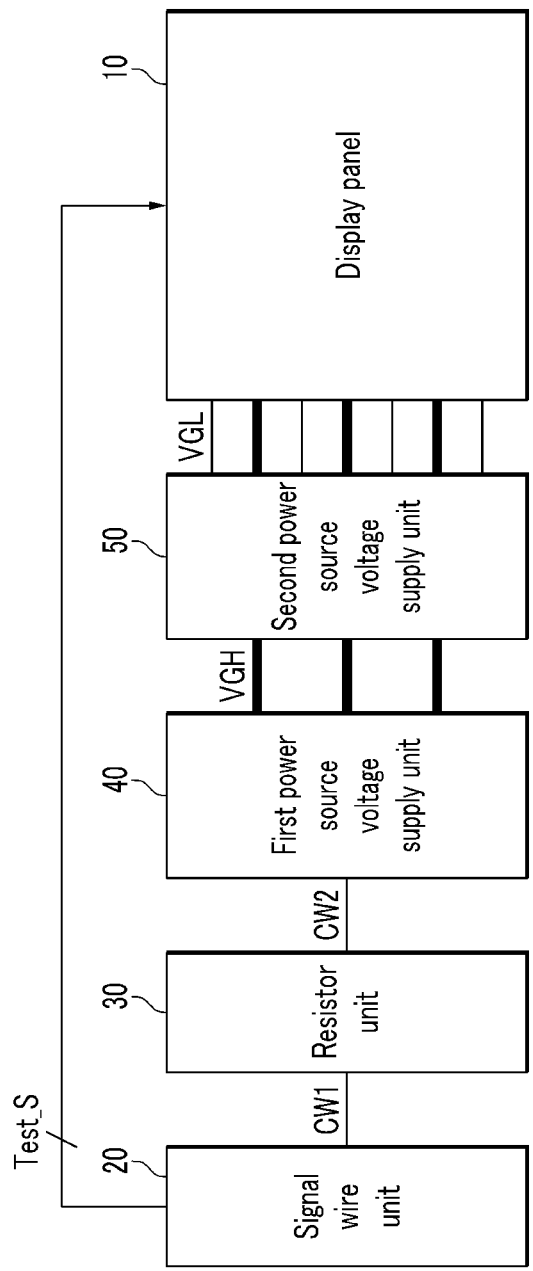
FIG. 2 is a schematic view of a partial constitution of a display device including a static electricity preventing circuit according to an embodiment.

FIG. 2 is a schematic view showing a partial constitution of a display device including a static electricity preventing circuit according to an embodiment.

A display device of the static electricity preventing display panel according to an embodiment includes a display panel 10, a first power source voltage supply unit 40, a second power source voltage supply unit 50, a resistor unit 30, and a signal wire unit 20. In the display device of FIG. 2, constitutions such as a driver supplying a scan signal, a data signal, a control signal to the display panel 10, and a controller controlling an operation of the driver are not shown.

The first power source voltage supply unit 40 and the second power source voltage supply unit 50 respectively may apply a predetermined driving power source voltage to drive the display panel 10. The driving power source voltage includes the first power source voltage as a predetermined high potential voltage and the second power source voltage as a predetermined low potential voltage. The second power source voltage has a lower voltage value than the first power source voltage.

The first power source voltage is applied from the first power source voltage supply unit 40 to the display panel 10 through a plurality of first power source voltage supply wires VGH respectively connected to a plurality of pixels of the display panel 10.

The second power source voltage is applied from the second power source voltage supply unit 50 to the display panel 10 through a plurality of second power source voltage supply wires VGL respectively connected to a plurality of pixels of the display panel 10.

A plurality of pixels included in the display panel 10 are respectively driven by receiving the first power source voltage of the high potential and the second power source voltage of the low potential. In this case, a current path of the driving current according to the image data signal is formed by a difference between the first power source voltage and the second power source voltage, and the light emitting element respectively included in the pixel emits light thereby displaying an image.

The resistor unit 30 is connected to the first power source voltage supply unit 40, thereby inducing an inflow of the current when dissipating the static electricity. That is, the resistor unit 30 is connected to the first power source voltage supply unit 40 through at least one connection wire CW2, and the static electricity current flowed from the outside is transmitted to the first power source voltage supply unit 40 through the connection wire CW2 thereby protecting the circuit of the display device from static electricity.

Also, the signal wire unit 20 supplies a predetermined signal for the lighting test of each pixel to test the normal light emitting operation of a plurality of pixels included in the display panel 10.

The signal wire unit 20 is connected to the resistor unit 30 through at least one connection wire CW1. The static electricity current that is generated at any position of the signal wire unit 20 or flows through the signal wire unit 20 is transmitted to the resistor unit 30 through the connection wire CW1, and as described above, the resistor unit 30 flows the static electricity current through the first power source voltage supply unit 40.

Meanwhile, the display panel 10 has a structure in which a plurality of pixels are arranged in a matrix shape, and although not shown in FIG. 2, each pixel is activated corresponding to the scan signal transmitted according to the operation control and emits light according to the corresponding data signal thereby displaying the image.

Also, the display panel 10 may display a test image by receiving a predetermined lighting test signal Test_S before displaying the image according to the image data transmitted from an external source.

The lighting test signal T_S is transmitted from the signal wire unit 20.

The lighting test signal T_S may include a plurality of test signals having a predetermined voltage value such as various test voltage values of a voltage value to display a red image by emitting red light through the pixel, a voltage value to display a green image by emitting green light through the pixel, and a voltage value to display a blue image by emitting blue light through the pixel.

Accordingly, the signal wire unit 20 may include a plurality of signal supply wires transmitting a plurality of test signals corresponding to the various test voltage values.

That is, the signal wire unit 20 may include a plurality of signal supply wires and transmit the test signal Test_S having the predetermined voltage value to test the lighting due to the driving of a plurality of pixels included in the display panel 10 to the display panel 10 through a plurality of signal supply wires.

As described above, the signal wire unit 20 is connected to the resistor unit 30 through a plurality of the first connection wires CW1.

FIG. 2 shows one wire, but it is not limited thereto. The first connection wire CW1 is formed in plural to respectively connect a plurality of signal supply wires of the signal wire unit 20 and the resistor unit 30. According to some embodiments, when the static electricity is generated in a plurality of signal supply wires, the static electricity current path is formed through the resistor unit 30 by the first connection wire CW1 to discharge the static electricity.

According to an embodiment, the resistor unit 30 is not limited to but may include the semiconductor layer made of polysilicon and the gate metal layer that is floated.

The resistor unit 30 is connected to the first power source voltage supply unit 40 through the second connection wire CW2. FIG. 2 shows one second connection wire CW2, but it is not limited thereto. The second connection wire CW2 may be formed in plural to connect the resistor unit 30 and the first power source voltage supply unit 40. When the static electricity is generated in a plurality of signal supply wires, the static electricity current transmitted to the resistor unit 30 through the first connection wire CW1 is discharged to the first power source voltage supply unit 40 through the second connection wire CW2.

Figure 3:
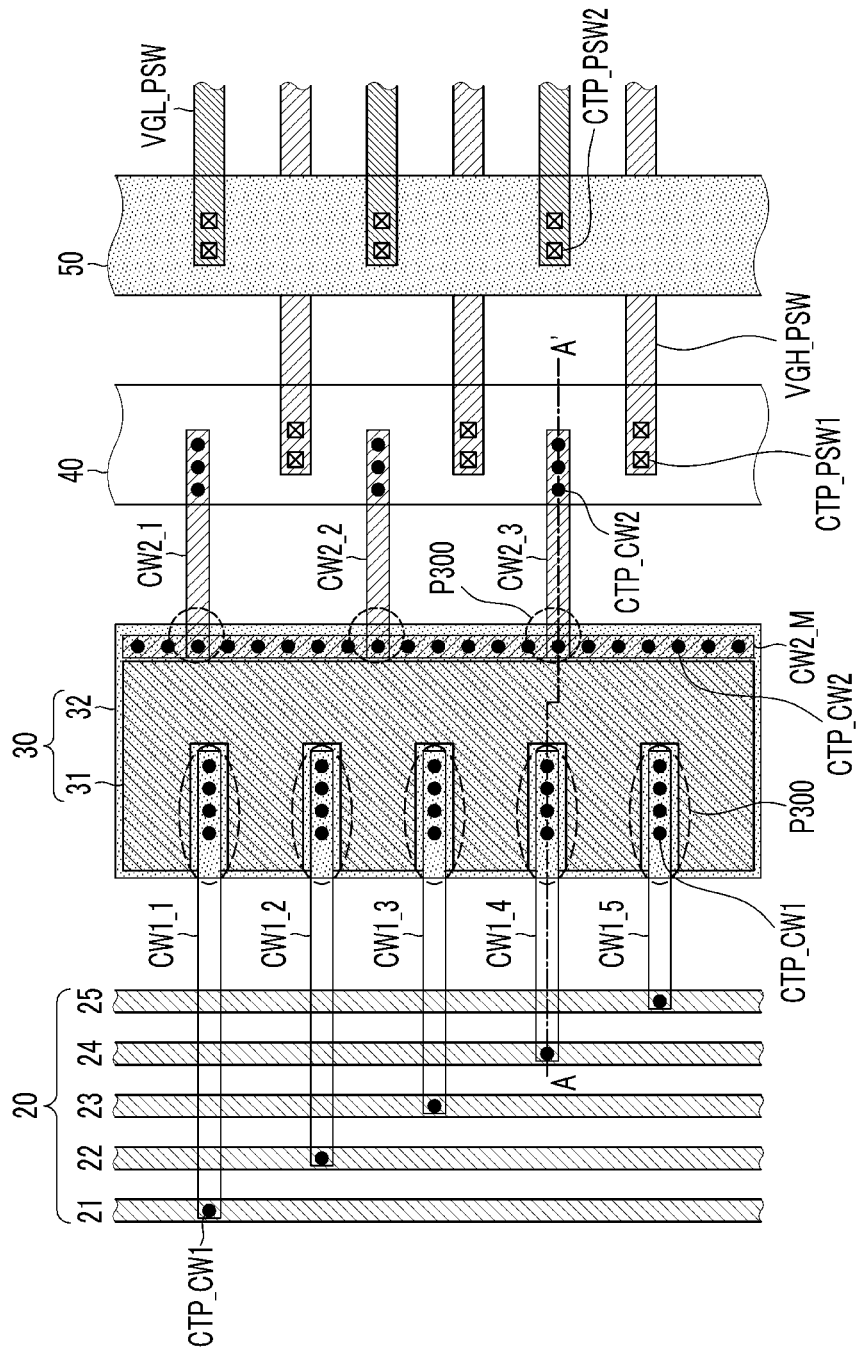
FIG. 3 is a schematic top view of a layout for a static electricity preventing circuit of a display panel according to an embodiment.

FIG. 3 is a schematic top view of a layout for a static electricity preventing circuit of a display panel according to an embodiment.

Particularly, FIG. 3 illustrates a layout structure of the signal wire unit 20, the resistor unit 30, the first power source voltage supply unit 40, and the second power source voltage supply unit 50 in the display device of FIG. 2.

In FIG. 3, the signal wire unit 20 includes five signal supply wires 21 to 25. This structure is an illustrative example, but the disclosed technology is not limited thereto.

The five signal supply wires are respectively connected to the corresponding first connection wire among a plurality of the first connection wires. In detail, for example, the first signal supply wire 21 transmitting the test signal corresponding to the red data voltage value to emit the red light for the pixel is electrically connected to the first connection wire CW1_1 among a plurality of the first connection wires through a contact hole CTP_CW1. The contact hole to electrically connect to the first connection wire is equally indicated by a numeral CTP_CW1 regardless of following constitutions.

By this method, the remaining signal supply wires 22 to 25 transmitting the test signal applied as the different voltage values are respectively connected to the corresponding first connection wires CW1_2 to CW1_5 among a plurality of the first connection wires through the contact hole. Here, the interval between a plurality of the first connection wires CW1_1 to CW1_5 may be disposed to be several tens of micrometers (um).

A plurality of the first connection wires CW1_1 to CW1_5 are connected to the resistor unit 30 through the contact hole CTP_CW1.

In FIG. 3, the resistor unit 30 includes a semiconductor layer 32 made of polysilicon and a gate metal layer 31 formed thereon via a gate insulation layer (not shown) interposed therebetween. In the signal wire unit 20, a plurality of the first connection wires CW1_1 to CW1_5 are electrically connected to the remaining region except for the region of the gate metal layer 31 through a plurality of contact holes CTP_CW1. That is, a plurality of the first connection wires CW1_1 to CW1_5 are respectively connected to an impurity doped region of the semiconductor layer 32 as the region except for the region of the gate metal layer 31.

Also, in the resistor unit 30, a plurality of the second connection wires CW2 are connected to a portion facing the portion to which a plurality of the first connection wires CW1_1 to CW1_5 are connected. Here, the interval between a plurality of the first connection wires CW1_1 to CW1_5 and a plurality of the second connection wires CW2 may be formed to be several tens of micrometers (um).

A plurality of the second connections wires CW2 include a main second connection wire CW2_M that is disposed at the portion facing the portion to which a plurality of the first connection wires are connected as the region where the gate metal layer 31 is not formed on the semiconductor layer 32 of the resistor unit, and a plurality of sub-second connection wires CW2_1 to CW2_3 following the main second connection wire CW2_M.

In the embodiment of FIG. 3, a plurality of sub-second connection wires CW2_1 to CW2_3 are designed as three connection wires, but it is not limited thereto.

A plurality of sub-second connection wires CW2_1 to CW2_3 are respectively connected to the first power source voltage supply unit 40.

The main second connection wire CW2_M is connected to the semiconductor layer 32 of the resistor unit through the contact hole CTP_CW2. Also, a plurality of sub-second connection wires CW2_1 to CW2_3 are respectively connected to the first power source voltage supply unit 40 through the contact hole CTP_CW2. The contact hole to electrically connect the second connection wire is indicated by the numeral CTP_CW2 regardless of the following constitutions.

In FIG. 3, a region where the gate metal layer 31 is formed among the semiconductor layer 32 of the resistor unit 30 is an intrinsic semiconductor region where an n-type or a p-type semiconductor impurity is not doped. Also, the region where the gate metal layer 31 is not formed among the semiconductor layer 32. That is, the region where a plurality of the first connection wires CW1_1 to CW1_5 and the main second connection wire CW2_M are formed is an impurity semiconductor region where the semiconductor impurity is doped. If necessary, like FIG. 3, the impurity doping region may be formed at only a portion of the region where the main second connection wire CW2_M is formed among the semiconductor layer 32 line at a dotted line.

In FIG. 3, the resistor unit 30 is formed of a PMOS transistor such that the impurity semiconductor region of the semiconductor layer 32 is a p-type impurity doping region P300 as shown by a circle of the dotted line. If the transistor forming the resistor unit 30 is an NMOS transistor, the impurity doping region of the semiconductor layer 32 may be doped with an n-type impurity.

Thus, a plurality of the first connection wires CW1_1 to CW1_5 and the main second connection wire CW2_M are connected to the semiconductor layer that is doped with the p-type impurity to be electrically connected.

Meanwhile, in FIG. 3, the first power source voltage supply unit 40 is separated from a plurality of sub-second connection wires CW2_1 to CW2_3 and is connected to the first power source voltage supply wire VGH_PSW transmitting the first power source voltage. In the embodiment of FIG. 3, the first power source voltage supply unit 40 is connected to a plurality of the first power source voltage supply wires VGH_PSW that are extended to each pixel of the display panel to be connected through the first contact hole CTP_PSW1, but it is not limited thereto. That is, the power supply wire may be designed to be directly divided from the first power source voltage supply unit 40.

Also, the second power source voltage supply unit 50, which is disposed beside the first power source voltage supply unit 40, is disposed to be separated from each other likewise the first power source voltage supply unit to be connected to the second power source voltage supply wire VGL_PSW transmitting the second power source voltage to each pixel of the display panel. The second power source voltage supply unit 50 is connected to a plurality of the second power source voltage supply wires VGL_PSW that are connected to the display panel through a plurality of the second contact holes CTP_PSW2, but it is not limited thereto and the power supply wire may be designed to be directly divided from the second power source voltage supply unit 50.

Figure 4:
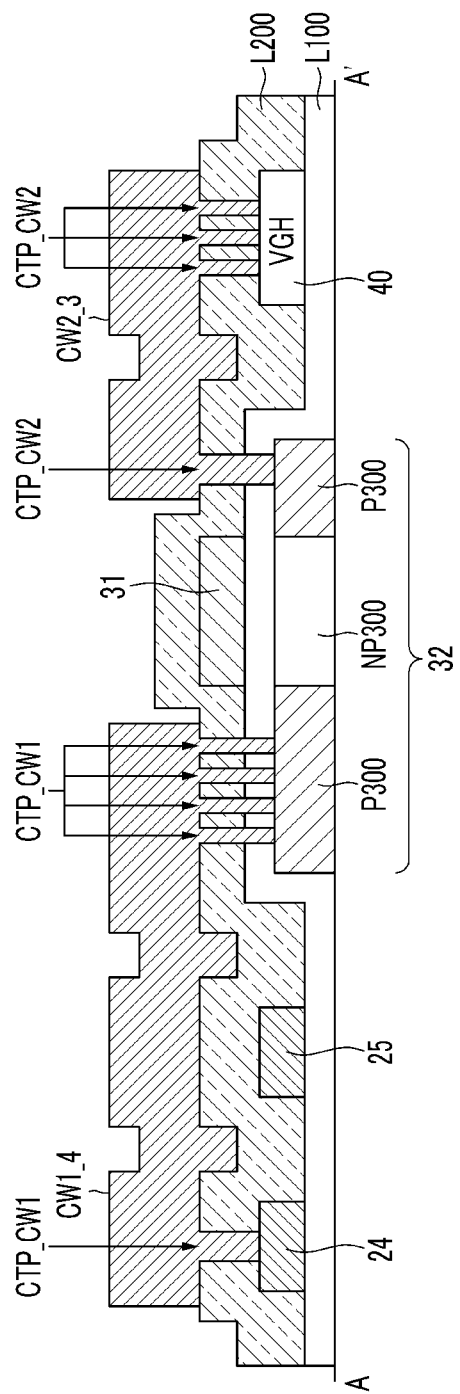
FIG. 4 is a schematic diagram of a cross-sectional structure taken along the line A-A' of FIG. 3.

To explain the structure of the static electricity preventing circuit of FIG. 3, FIG. 4 is a view of a cross-sectional structure taken along the line A-A' of FIG. 3.

Also, although not shown in FIG. 4, an insulation substrate may be disposed at a lowest side of the cross-section taken along line A-A'.

For example, an insulation substrate and a buffer layer made of silicon oxide may be formed under the semiconductor layer 32 of the resistor unit 30, but these constitutions are not shown in the cross-section view of the static electricity preventing circuit.

Firstly, a semiconductor layer 32 made of a polysilicon (Poly-Si) included in a resistor unit 30 may be formed.

A gate insulation layer L100 is formed on the semiconductor layer 32. Examples of a forming material of the gate insulation layer L100 may include but are not limited to an inorganic material such as silicon oxide $SiO_2$, silicon nitride SiNx, a mixture material thereof, and an organic material such as PVP (polyvinylphenol) and polyimide. Also, the gate insulation layer L100 may not be formed with a singular layer like in FIG. 4, but may be formed with at least two layers.

After forming the gate insulation layer L100, a gate metal layer 31 is formed by patterning on a region where the semiconductor layer 32 is formed.

After patterning the gate metal layer 31, an impurity is doped by using the gate metal layer 31 as a doping blocking layer, in the embodiment of FIG. 4, the p-type impurity is doped thereby forming a p-type impurity doping region P300. Thus, an intrinsic semiconductor layer region NP300 in which the impurity is not doped is formed in the semiconductor layer 32 positioned under a region where the gate metal layer 31 is formed.

Meanwhile, after forming the gate insulation layer L100, the signal supply wire and the first power source voltage supply unit 40 are formed by the patterning at a predetermined region.

As shown in the structure of FIG. 3, the signal supply wire is the fourth signal supply wire 24 and the fifth signal supply wire 25 included in the signal wire unit 20 among a plurality of signal supply wires.

The signal supply wire and the first power source voltage supply unit 40 are a metal wire transmitting a lighting test signal and the first power source voltage having a predetermined voltage value.

A material for forming the metal wires is not limited, and it may be a material having conductivity or alloys thereof. Particularly, it may be a metallic material such as molybdenum (Mo), tantalum (Ta), cobalt (Co), or alloys thereof.

The signal supply wire and the first power source voltage supply unit 40 may be formed with the same conductive material, or may be formed with different conductive materials.

After patterning the signal supply wire and the first power source voltage supply unit 40, and the gate metal layer 31, an interlayer insulation layer L200 is formed thereon.

A forming material of the interlayer insulation layer L200 is not limited, but like the gate insulation layer L100, an inorganic material such as silicon oxide $SiO_2$, silicon nitride SiNx, a mixture material thereof, or an organic material such as PVP (polyvinylphenol) and polyimide may be used. The interlayer insulation layer L200 may not be formed with a singular layer like FIG. 4, but may be formed with at least two layers. Also, the interlayer insulation layer L200 may be formed with the same material as the gate insulation layer L100, or may be formed with the different material.

The first connection wire and the second connection wire are formed on the interlayer insulation layer L200.

In the cross-sectional structure of FIG. 4, the first connection wire is a connection wire CW1_4 connecting the fourth signal supply wire 24 and a p-type impurity doping region P300 of the semiconductor layer 32 of the resistor unit 30.

Accordingly, the interlayer insulation layer L200 must be patterned to expose upper surfaces of the fourth signal supply wire 24 and the portion of the p-type impurity doping region P300 of the semiconductor layer 32, thereby forming a contact hole CTP_CW1 as shown in FIG. 4.

The first connection wire CW1_4 deposited after patterning the contact hole CTP_CW1 may electrically connect the fourth signal supply wire 24 and the p-type impurity doping region P300 of the semiconductor layer 32.

Meanwhile, in FIG. 4, the second connection wire is a connection wire CW2_3 connecting the p-type impurity doping region P300 of the semiconductor layer 32 and the first power source voltage supply unit 40. Here, the p-type impurity doping region P300 is formed at a position facing the p-type impurity doping region P300 to which the first connection wire CW1_4 is connected.

Before forming the second connection wire CW2_3, the interlayer insulation layer L200 must be patterned to expose the upper surfaces of the p-type impurity doping region P300 of the semiconductor layer 32 and the portion of the first power source voltage supply unit 40, thereby forming the contact hole CTP_CW2 like in FIG. 4.

The second connection wire CW2_3 deposited after patterning the contact hole CTP_CW2 may electrically connect the p-type impurity doping region P300 of the semiconductor layer 32 and the first power source voltage supply unit 40.

A material for forming the first connection wire CW1_4 and the second connection wire CW2_3 is not limited and may be a metallic material having conductivity. Particularly, a conductive material of titanium (Ti), aluminum (Al), and an alloy (Ti/Al/Ti) thereof may be used. Also, the first connection wire CW1_4 and the second connection wire CW2_3 may be formed with the same metallic material, or may be formed with a different conductive material.

Figure 5:
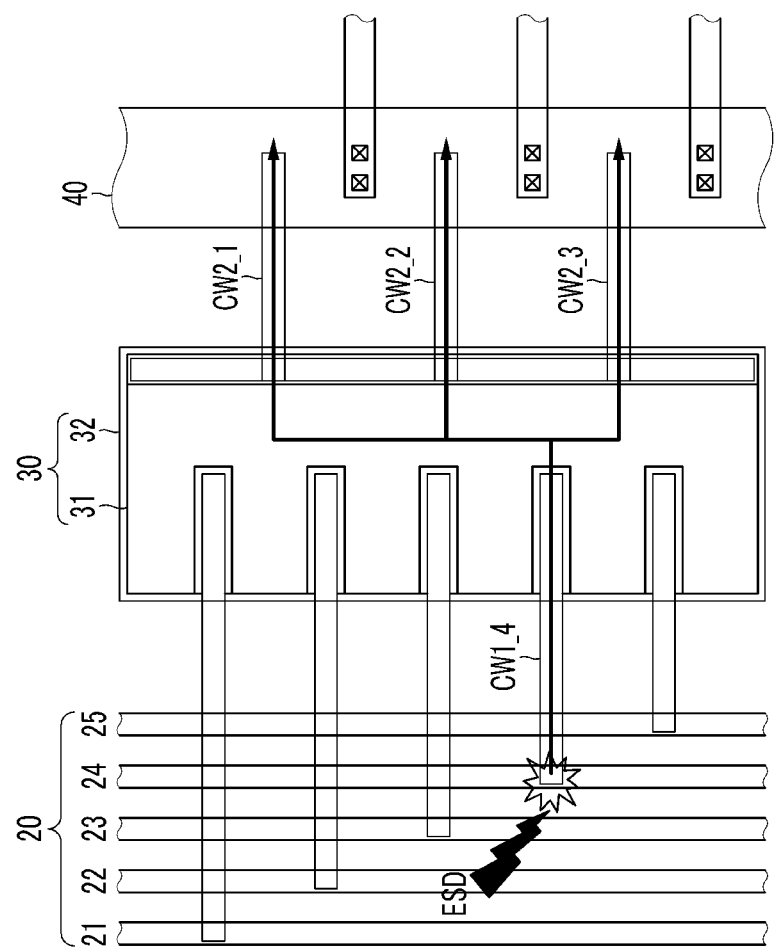
FIG. 5 is a view of a discharge path when static electricity flows in the static electricity preventing circuit of the display panel having the structure of FIG. 3.

FIG. 5 is a view of a discharge path when static electricity flows into the static electricity preventing circuit of the display panel having the structure of FIG. 3 and FIG. 4.

In the static electricity preventing circuit having the structure as shown in FIG. 3, the potential of the gate metal layer 31 forming the resistor unit 30 may be maintained with the voltage of the signal supply wire applying the first power source voltage or the lighting test signal in the floated state.

In this state, if the static electricity is generated in the portion of the predetermined signal supply wire of the signal wire unit 20 like in FIG. 5, static electricity having higher potential than the first power source voltage may flow in from the outside. Thus, the current generated by the static electricity is transmitted to the p-type impurity doping region P300 of the semiconductor layer 32 through the first connection wire (CW1_4 in FIG. 5) connected to the signal supply wire (24 in FIG. 5) where the static electricity is generated such that the potential of this portion is relatively higher than the potential of the floated gate metal layer 31. Thus, the resistor unit 30 formed with the PMOS transistor is turned on. Thus, the current generated by the static electricity flows so that the p-type impurity doping region P300 of the semiconductor layer 32 having the high voltage becomes a source and the other p-type impurity doping region P300 of the semiconductor layer 32 having the low voltage becomes a drain thereby forming a channel.

The other p-type impurity doping region P300 of the semiconductor layer 32 having the relatively low voltage is electrically connected through the second connection wire CW2_3 to the first power source voltage supply unit 40 as shown in FIG. 4 such that the static electricity current transmitted through the channel formation is discharged toward the first power source voltage supply unit 40.

That is, as shown in an arrow direction of FIG. 5, the static electricity current generated in the signal supply wire 24 is transmitted to the first power source voltage supply unit 40 through a plurality of the second connection wires CW2_1 to CW2_3.

Also, according to the static electricity preventing circuit in some embodiments, even if the signal wire unit 20 is damaged by the static electricity that flows from the outside, an equalpotential is controlled through the resistor unit 30 connected between the signal supply wires 21 to 25 and the first power source voltage supply unit 40 such that stable driving of the display panel may be maintained.

The drawings referred to hereinabove and the detailed description of the disclosed invention are presented for illustrative purposes only, and are not intended to define meanings or limit the scope of the disclosed technology as set forth in the following claims. Those skilled in the art will understand that various modifications and equivalent embodiments of the present invention are possible. Further, a person having ordinary skill in the art can omit some of the constituent elements described in the specification without deteriorating performance or can add constituent elements in order to improve performance. In addition, a person having ordinary skill in the art may change the sequence of the steps described in the specification according to process environments or equipment. Accordingly, the scope of the disclosed technology should be determined not by the above-described embodiments, but by the appended claims and their equivalents.

What is claimed is:

1. A static electricity preventing circuit, comprising:
a power source voltage supply unit configured to apply a power source voltage to drive a display panel, wherein the power source voltage includes a first power source voltage and a second voltage power source voltage less than the first power source voltage, and wherein the display panel comprises a plurality of pixels respectively configured to display one or more images through light emission according to one or more data voltages of a plurality of image data signals;
a signal wire unit configured to transmit a plurality of lighting test signals for a lighting test of the plurality of pixels included in the display panel; and
a resistor unit positioned between the power source voltage supply unit and the signal wire unit and configured to discharge static electricity generated in the signal wire unit through the power source voltage supply unit when a voltage level of the static electricity is greater than a reference voltage,
wherein the resistor unit comprises:
an interlayer insulation layer having a plurality of first contact holes and a plurality of second contact holes formed therethrough;
a semiconductor layer including a source region, a drain region, and an intrinsic semiconductor region interposed between the source and drain regions, wherein the source region is connected to the signal wire unit via a first connection wire passing through the first contact holes, and wherein the drain region is connected to the first power source voltage via a second connection wire passing through the second contact holes;

a gate insulation layer formed over the semiconductor layer and formed below the interlayer insulation layer; and a gate metal layer formed over the gate insulation layer, wherein the gate metal layer overlaps the intrinsic semiconductor region of the semiconductor layer in the depth dimension of the resistor unit.

2. The static electricity preventing circuit of claim 1, wherein the signal wire unit includes a plurality of signal supply wires respectively transmitting the plurality of lighting test signals transmitted to the plurality of pixels included in the display panel; and the plurality of lighting test signals respectively have different voltage values.

3. The static electricity preventing circuit of claim 2, wherein the different voltage values are voltages respectively corresponding to image data voltages for emitting light of red, green, and blue through the plurality of pixels.

4. The static electricity preventing circuit of claim 1, wherein the signal wire unit includes a plurality of signal supply wires transmitting the plurality of lighting test signals to the plurality of pixels included in the display panel, wherein the plurality of lighting test signals respectively have different voltage values; and the plurality of signal supply wires are respectively connected to the resistor unit through a plurality of the first connection wires.

5. A display device comprising:

a display panel including a plurality of pixels, wherein the plurality of pixels are respectively configured to display one or more images through light emission according to one or more data voltages of a plurality of image data signals;

a first power source voltage supply unit configured to apply a first power source voltage to drive the display panel;

a second power source voltage supply unit configured to apply a second power source voltage that is lower than the first power source voltage;

a signal wire unit configured to transmit a plurality of lighting test signals having one or more predetermined voltage values for the plurality of pixels included in the display panel; and a resistor unit positioned between the first power source voltage supply unit and the signal wire unit and configured to induce a current to discharge static electricity generated in the signal wire unit through the first power source voltage supply unit when a voltage level of the static electricity is greater than a reference voltage, wherein the resistor unit includes:

an interlayer insulation layer having a plurality of first contact holes and a plurality of second contact holes formed therethrough;

a semiconductor layer including a source region, a drain region, and an intrinsic semiconductor region interposed between the source and drain regions, wherein the source region is connected to the signal wire unit via a first connection wire passing through the first contact holes, and wherein the drain region is connected to the first power source voltage via a second connection wire passing through the second contact holes;

a gate insulation layer formed over the semiconductor layer and formed below the interlayer insulation layer; and a gate metal layer formed over the gate insulation layer, wherein the gate metal layer overlaps the intrinsic semiconductor region of the semiconductor layer in the depth dimension of the resistor unit.

6. The display device of claim 5, wherein the signal wire unit includes the plurality of signal supply wires respectively transmitting the plurality of lighting test signals to the plurality of pixels included in the display panel and the plurality of lighting test signals have different voltage values.

7. The display device of claim 6, wherein the different voltage values are voltages respectively corresponding to image data voltages for emitting light of red, green, and blue through a plurality of pixels.

8. The display device of claim 5, wherein the signal wire unit includes a plurality of signal supply wires respectively transmitting the plurality of lighting test signals to the plurality of pixels included in the display panel and the plurality of lighting test signals have different voltage values; and the plurality of signal supply wires are respectively connected to the resistor unit through a plurality of the first connection wires.

\* \* \* \* \*